(12) United States Patent
Shubat

(10) Patent No.: US 7,114,118 B1
(45) Date of Patent: Sep. 26, 2006

(54) SYSTEM AND METHOD FOR PROVIDING ADJUSTABLE READ MARGINS IN A SEMICONDUCTOR MEMORY

(75) Inventor: Alex Shubat, Fremont, CA (US)

(73) Assignee: Virage Logic Corp., Fremont, CA (US)

( * ) Notice: Subject to any disclaimer, the term of this patent is extended or adjusted under 35 U.S.C. 154(b) by 756 days.

(21) Appl. No.: 10/216,598

(22) Filed: Aug. 9, 2002

(51) Int. Cl.
G11C 29/30 (2006.01)
G11C 29/20 (2006.01)

(52) U.S. Cl. .................. 714/763; 714/718; 714/724
(58) Field of Classification Search ............. 714/724, 714/730, 738, 763, 718; 365/230.06
See application file for complete search history.

(56) References Cited

U.S. PATENT DOCUMENTS

| 5,883,844 A | * | 3/1999 | So .............................. 365/201 |
| 6,477,370 B1 | * | 11/2002 | Sigler et al. ................. 455/427 |
| 6,687,183 B1 | * | 2/2004 | Peterson et al. ........ 365/230.06 |
| 6,792,576 B1 | * | 9/2004 | Chidlovskii .................. 715/517 |
| 2003/0120457 A1 | * | 6/2003 | Singh et al. ................. 702/181 |

* cited by examiner

Primary Examiner—Albert Decady
Assistant Examiner—Dipakkumar Gandhi
(74) Attorney, Agent, or Firm—Danamraj & Youst, P.C.

(57) ABSTRACT

A system and method for effectuating a self-timed clock (STC) loop for memory access operations wherein an Embedded Test and Repair (ETR) processor engine is utilized for optimizing an access margin value. Upon compiling a semiconductor memory instance based on its configuration data, a default access margin value is passed to a wrapper interface associated with the memory instance. In one implementation, an adjusted access margin value is determined by an optimization algorithm operable to be executed on the ETR processor engine, which adjusted access margin value is used for generating the STC signal with a particular time setting that is optimized for a memory instance of a given size.

15 Claims, 4 Drawing Sheets

| RM SETTING 402 | | | | TIMING | EFFECTIVE SA SIGNAL |
|---|---|---|---|---|---|
| RM0 | RM1 | RM2 | RM3 | | |
| 0 | 0 | 0 | 0 | SLOWEST | 200 mV |
| 0 | 0 | 0 | 1 | | 170 mV |
| ⋮ | ⋮ | ⋮ | ⋮ | ⋮ | ⋮ |
| 1 | 1 | 1 | 0 | | 25 mV |
| 1 | 1 | 1 | 1 | FASTEST | 20 mV |

SYSTEM AND METHOD FOR PROVIDING ADJUSTABLE READ MARGINS IN A SEMICONDUCTOR MEMORY

CROSS-REFERENCE TO RELATED APPLICATION(S)

This nonprovisional application discloses subject matter related to the subject matter disclosed in the following commonly owned co-pending United States patent application(s): (i) Embedded Test And Repair Scheme And Interface For Compiling A Memory Assembly With Redundancy Implementation, application Ser. No. 10/144,020, filed May 13, 2002, in the name(s) of; Alex Shubat and Randall Lee Reichenbach; and (ii) Semiconductor Memory With Multiple Timing Loops, application Ser. No. 10/279,428, filed Oct. 24, 2002, in the name(s) of: Deepak Sabharwal, now issued as U.S. Pat. No. 6,711,092, which is (are) hereby incorporated by reference.

BACKGROUND OF THE INVENTION

1. Technical Field of the Invention

The present invention relates generally to semiconductor memories. More particularly, and not by way of any limitation, the present invention is directed to a system and method for providing adjustable access margins in a semiconductor memory device.

2. Description of Related Art

Silicon manufacturing advances today allow true single-chip systems to be fabricated on a single die (i.e., System-On-Chip or SOC integration). However, there exists a "design gap" between today's electronic design automation (EDA) tools and the advances in silicon processes which recognizes that the available silicon real-estate has grown much faster than has designers' productivity, leading to underutilized silicon. Unfortunately, the trends are not encouraging: the "deep submicron" problems of non-convergent timing, complicated timing and extraction requirements, and other complex electrical effects are making silicon implementation harder. This is especially acute when one considers that analog blocks, non-volatile memory, random access memories (RAMs), and other "non-logic" cells are being required. The gap in available silicon capacity versus design productivity means that without some fundamental change in methodology, it will take hundreds of staff years to develop leading-edge integrated circuits (ICs).

Design re-use has emerged as the key methodology solution for successfully addressing this time-to-market problem in semiconductor IC design. In this paradigm, instead of re-designing every part of every IC chip, engineers can re-use existing designs as much as possible and thus minimize the amount of new circuitry that must be created from scratch. It is commonly accepted in the semiconductor industry that one of the most prevalent and promising methods of design re-use is through what are known as Intellectual Property ("IP") components—pre-implemented, re-usable modules of circuitry that can be quickly inserted and verified to create a single-chip system. Such re-usable IP components are typically provided as megacells, cores, macros, embedded memories through generators or memory compilers, et cetera.

It is well known that memory is a key technology driver for SOC design. It is also well known that performance parameters such as access time, overall memory cycle time, power consumption, et cetera, play a pivotal role in designing a memory circuit, whether provided in an embedded SOC application or as a stand-alone device. These parameters can be critically dependent on the topology of a memory array. For high-speed memories, accordingly, it is desirable that these parameters such as access time are optimized regardless of the memory array sizes.

To achieve efficiency, access operations in most memories today are provided to be self-timed. That is, memory accesses typically require only a rising edge of an external clock signal, which is used to manufacture an internal memory clock that provides a time base for access operations. A shutdown signal is subsequently generated for effectuating access shutdown. Thus, in essence, a Self-Timed Clock (STC) is imposed on the memory accesses.

Many techniques are available for generating the self-timed access clock in current memories. Regardless of the implementational variations, the basic concept remains the same: selecting a particular array wordline (WL) based on address signals specified for an access operation, monitoring array bitline(s) (BLs) to determine if they have discharged to a particular level, and turning off the WL at an appropriate time.

It should be appreciated that the conventional STC schemes are highly sensitive to the array sizes because the electrical characteristics—therefore, timing delays—are topology-dependent. As a consequence, while a specific STC arrangement may be satisfactory with respect to a memory device of particular size and aspect, it may be entirely inadequate for other memory sizes. This deficiency is especially exacerbated in compilable memories which, by definition, are capable of generating numerous memory instances having different array sizes, aspect ratios, and I/O configurations, thereby necessitating different STC settings to optimize read accesses.

SUMMARY OF THE INVENTION

Accordingly, the present invention advantageously provides a system and method for effectuating a Self-Timed Clock (STC) loop for memory access operations wherein an Embedded Test and Repair (ETR) processor engine is utilized for optimizing a "read margin" (RM) value. For purposes of the present invention, RM values connote access margin (AM) values used in the context of memory read operations as well as memory write operations. Upon compiling a semiconductor memory instance based on its configuration data, a default RM value is passed to a wrapper interface associated with the memory instance. In one implementation, an adjusted RM value is determined by an optimization algorithm operable to be executed on the ETR processor engine, which adjusted RM value is used for generating the STC signal with a particular time setting that is optimized for a memory instance of a given size. In another implementation, the RM value may be hard-wired by setting a plurality of RM signals to a particular combination of logic. In a further implementation, the RM value may be determined by stress-testing the memory using a number of predetermined patterns and varying the RM value. In a still further implementation, an RM override command may be provided by the ETR processor engine in response to user input.

In another aspect, the present invention is directed to a semiconductor memory device having the capability to adjust its RM value. Circuitry is provided in a control block of the memory device to generate an internal memory clock based on an external clock (also referred to as system clock or main clock) provided thereto. The internal memory clock is operable as a timing reference for the memory access operations of the memory device. The control block and row decoder circuitry of the memory device are operable to commence an access operation cycle based on a plurality of address signals. A wrapper interface associated with the array of the device facilitates provision of an RM value to the array for selecting an STC signal with respect to the access operation. The control block of the memory device also includes circuitry for generating an STC signal having a particular time setting based on the selected RM value, which can be a default value, a user-determined value, or a value determined by an algorithmic optimization process run on the ETR processor engine associated with the device.

BRIEF DESCRIPTION OF THE DRAWINGS

A more complete understanding of the present invention may be had by reference to the following Detailed Description when taken in conjunction with the accompanying drawings wherein.

DETAILED DESCRIPTION OF THE DRAWINGS

Figure 1:
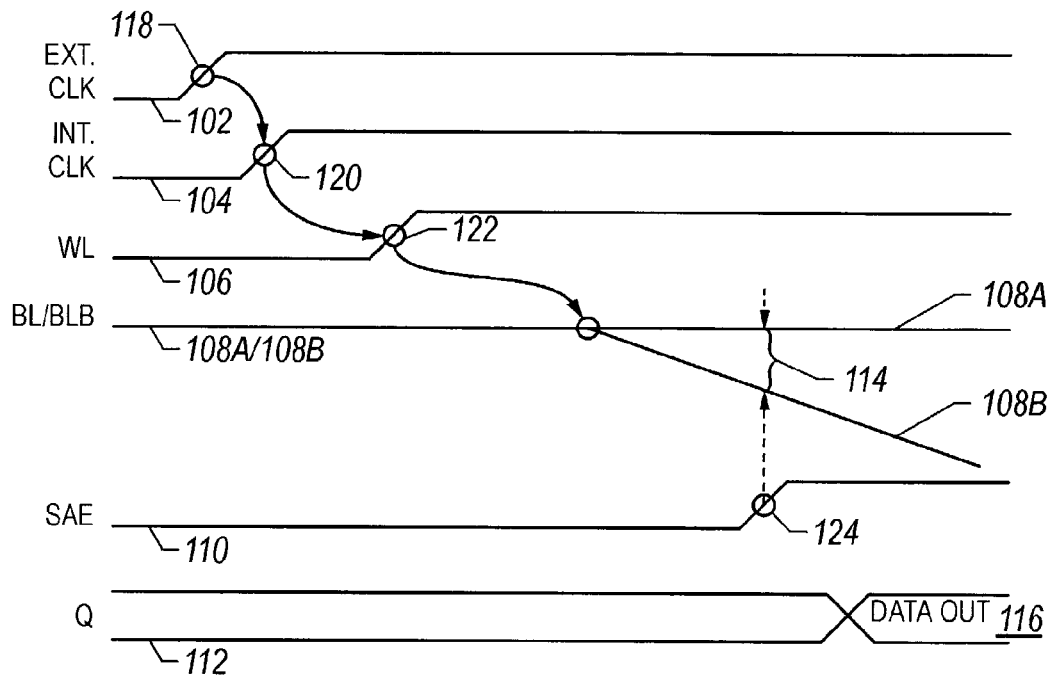
FIG. 1 depicts an exemplary timing diagram for a memory read operation wherein the teachings of the present invention may be advantageously practiced.

In the drawings, like or similar elements are designated with identical reference numerals throughout the several views thereof, and the various elements depicted are not necessarily drawn to scale. Without any limitation, the teachings of the present invention will be described in reference to memory read operations, where it should be recognized that the teachings are equally applicable to memory write operations, mutatis mutandis. Hence, where ever read operations are described, one skilled in the art will appreciate that memory access operations are meant therein. Likewise, any reference to read margins in the context of the present patent application, including the drawings, should imply access margins. Referring now to FIG. 1, depicted therein is exemplary timing diagram for a memory read operation wherein the teachings of the present invention may be advantageously practiced. As is well known in the memory design art, an external clock 102, also referred to as main clock or system clock, is provided to an exemplary semiconductor memory device for coordinating its various memory operations. In this sense, the external clock 102 provides a time base that operates as a system-level timing reference for the memory device. To effectuate self-timed access capability, which is common in most high performance memories, an internal memory clock is typically generated based on the external clock. Reference numeral 104 refers to an exemplary internal clock manufactured by the memory device, which is used for providing a timing loop for read access operations. In one implementation, a rising edge 118 in the external clock 102 may be used for generating a rising edge 120 in the internal memory clock 104, which rising edge 120 is operable to synchronize a memory read access timing loop. Responsive to the internal clock's rising edge 120, a selected wordline (WL) 106 is driven HIGH, as exemplified by its rising edge 122. Reference numerals 108A and 108B refer to the complementary bitlines (BL and BLB) coupled to the accessed memory cell, whose voltage levels begin to separate based on the binary data stored at the complementary data nodes of the cell. A Sense Amp Enable (SAE) signal 110 is generated subsequently, as indicated by its rising edge 124, at a point where the voltage separation between the BL and BLB paths is of sufficient level (reference numeral 114) such that the SA circuit can accurately sense the data, Valid data output (DATA OUT 116) follows thereafter, as indicated by the valid logic levels on the output path (Q) 112. For instance, if BLB is driven LOW and BL is driven HIGH, a logic 1 is sensed.

As alluded to in the Background section of the present patent application, it is clear that the timing of SAE generation is of critical importance. If the SAE signal is generated too fast, there may not be a sufficient BL voltage separation and wrong data can therefore be sensed by the SA. On the other hand, if the SAE signal is generated after a long period in order to ensure that sufficient voltage separation has occurred, it will negatively impact the access time ($t_{CQ}$), an undesirable feature in a high performance memory.

Figure 2:
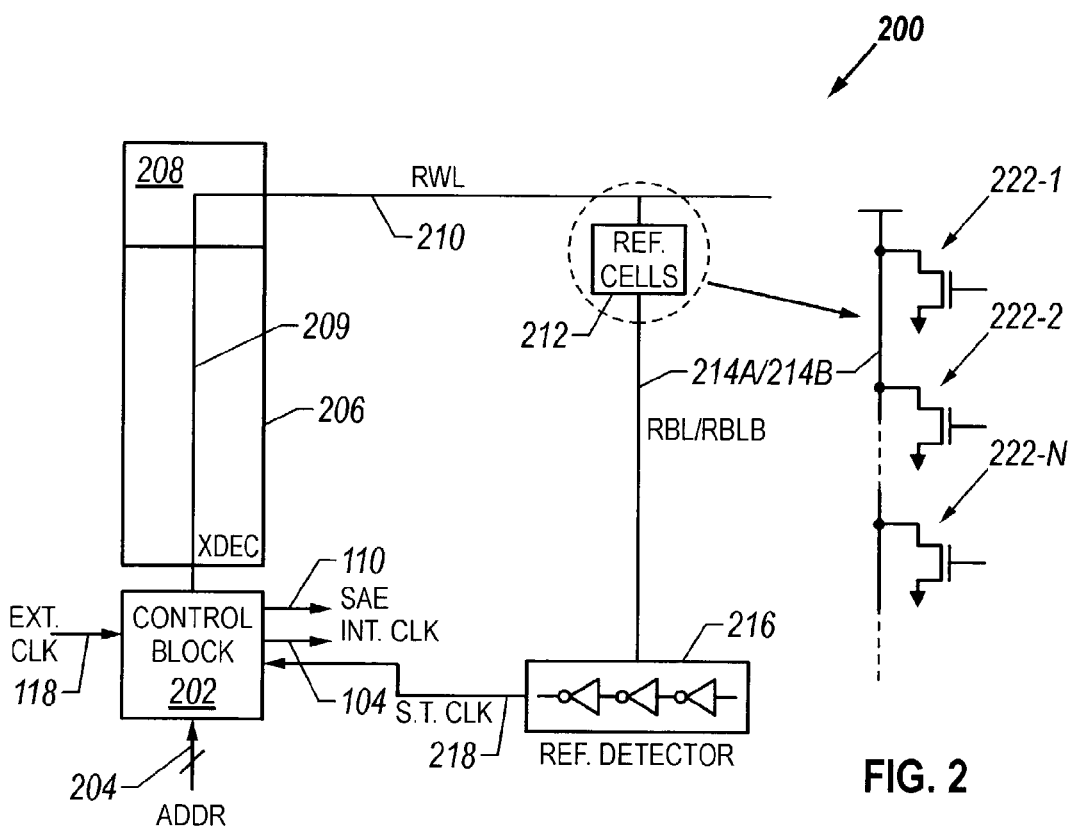
FIG. 2 depicts a high-level functional block diagram of a memory circuit portion employed for generating a Self-Timed Clock (STC) to control memory read operation timing.

FIG. 2 depicts a high-level functional block diagram of a memory circuit portion 200 employed for generating a Self-Timed Clock (STC) to control memory read operation timing, i.e., the generation of SAE signal. A control block 202 of the memory circuit portion 200 includes timing generator circuitry that is operable to manufacture the internal memory clock 104 in response to the external clock 118. A plurality of address signals 204 are provided to the control block 202 pursuant to a memory read operation. At least a portion the address signals are decoded by a row decoder (XDEC) 206 to select a particular WL.

To effectuate the STC loop, one or more reference control signals 209 are generated by the control block 202, wherein the control signals 209 are provided to a reference decoder block 208. A reference WL (RWL) is selected (i.e., driven HIGH) by the reference decoder block 208 responsive to the reference control signals 209 provided thereto. A reference cell assembly 212 coupled to the selected RWL is operable to generate a voltage separation on a pair of reference BL and BLB paths, i.e., RBL/RBLB paths, 214A/214B connected thereto. A reference detector 216 operable to sense the RBL/RBLB voltage separation includes circuitry to generate STC 218 that is looped back to the control block 202. An SAE signal generator circuit provided as part of the control block 202 generates SAE signal 110 in response to the STC signal 218. Since the RBL/RBLB discharge path is designed to track the actual BL/BLB separation in the memory array, the STC signal generated upon RBL/RBLB voltage level separation ensures that the voltage levels on the BL/BLB paths is also of sufficient magnitude for sensing the data correctly.

Figure 3:
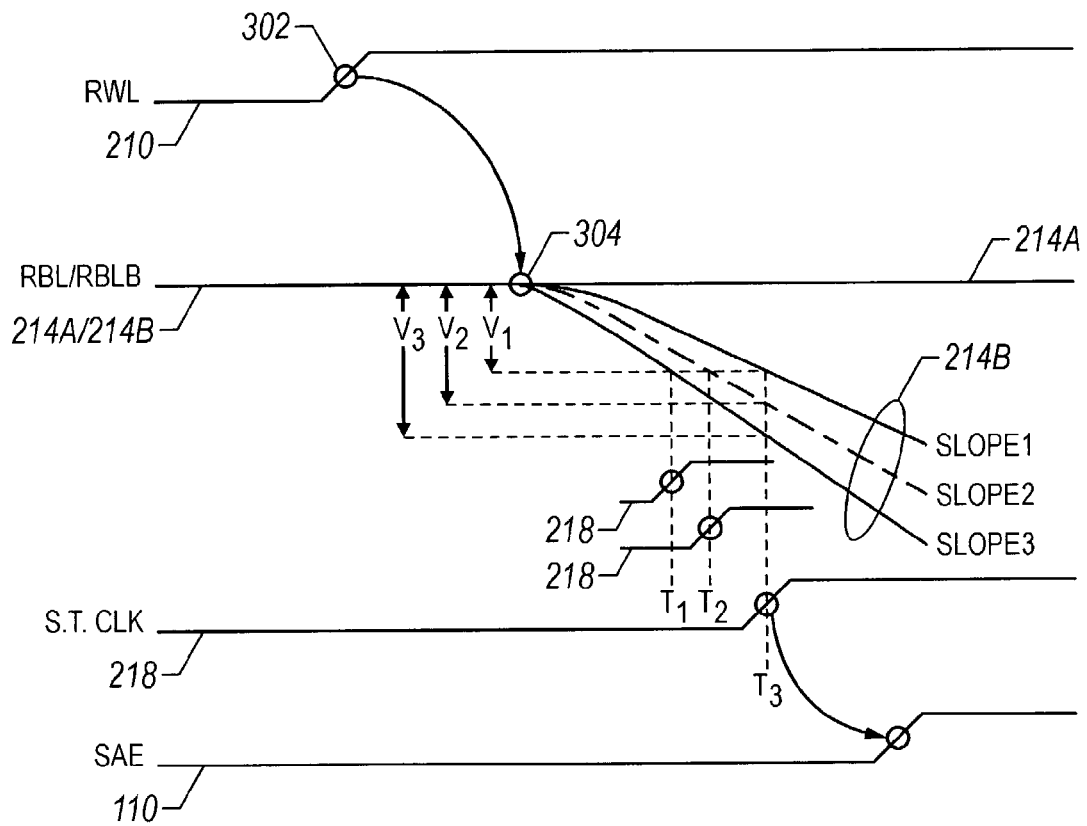
FIG. 3 depicts an exemplary timing diagram for a memory read operation wherein the timing of a reference signal used in generating the STC signal can be adjusted in accordance with the teachings of the present invention.

The reference cell assembly 212 may be comprised of one or more reference cells, which are selectably coupled to the RBL/RBLB path to modulate its rate of voltage separation (i.e., the slope of the discharging bitline). Reference numerals 222-1 through 222-N refer to N reference cells, wherein a faster discharge rate may be obtained by coupling more cells. Referring now to FIG. 3, depicted therein is an exemplary timing diagram for a memory read operation wherein the timing of a reference signal voltage (i.e., RBL/RBLB level) used in generating the STC signal can be adjusted in accordance with the teachings of the present invention. After RWL 210 is selected (as indicated by its rising edge 302), voltage levels on the RBL/RBLB lines begin to separate at a point 304. In the illustrated timing scenario, a slower discharge rate of RBLB 214B is obtained by using fewer reference cells for pulling down the RBLB path. This discharge curve is labeled SLOPE 1. Similarly, discharge curves SLOPE 2 and SLOPE 3 are obtained by increasing the number of the reference cells used for pulling the RBL/RBLB paths. If a particular voltage separation (e.g., $V_1$) is necessary for accurately sensing the data (i.e., the SA trip voltage), then it can be readily seen that the SLOPE 3 discharge curve is capable of attaining it the quickest, at $T_1$. On the other hand, SLOPE 1 curve is able to achieve the same separation at $T_3$, which is longer than $T_1$ and $T_2$. The STC signal 218 can therefore be generated at different times (i.e., with different time settings) by modulating the RBL/RBLB discharge curve slope with the use of a "configurable" reference cell assembly. Consequently, the SAE signal 110 can be generated based on the STC signal 218 for correctly sensing the data on the BL/BLB path at the most opportune instance.

Since the RBL/RBLB discharge slope can be modulated by varying the number of reference cells selected, an optimized STC signal may be generated for any memory regardless of its SA trip voltage, also sometimes referred to as its read margin (RM) value. For instance, trip voltages $V_2$ and $V_3$ may be suitable for memory circuits of different sizes, which can vary depending upon a memory array's configuration, e.g., the Number of Words (NW), the Number of Bits (NB), and the column MUX information. Thus, a plurality of control signals, referred to as RM signals, may be provided in accordance with the teachings of the present invention, in order to selectably configure the reference cell assembly for supporting different RM settings. Further, it should be appreciated that since the RM settings can be provided to suit memories of different aspect ratios and configurations, the configurability of the reference cell assembly is particularly advantageous in the context of memory compilers that are capable of generating a number of memory instances having different sizes and arrangements. In this regard, the RM signals are operable somewhat similar to the control signals provided for selecting different access timing loops described in the following commonly owned co-pending U.S. patent application entitled: Semiconductor Memory With Multiple Timing Loops, application Ser. No. 10/279,428, filed Oct. 24, 2002, in the name(s) of: Deepak Sabharwal, now issued as U.S. Pat. No. 6,711,092, which is hereby incorporated by reference.

Figure 4:
FIG. 4 depicts an exemplary table of various read margin settings that may be obtained by using a plurality Read Margin (RM) signals, which read margin settings can be used for adjusting the STC timing.

FIG. 4 depicts an exemplary table 400 of various RM settings 402 that may be obtained by using four RM signals, RM[0:3]. As set forth above, the RM settings can be used for adjusting the STC timing (hence, the SAE timing) for different memory configurations. For instance, with RM0=RM1=RM2=RM3=0, a slow setting (i.e., longer time to generate the appropriate rising edge) can be implemented that gives rise to a higher voltage SA signal (e.g., 200 mV).

On the other hand, with RM0=RM1=RM2=RM3=1, a fast setting can be achieved, where the effective SA signal level is lower (e.g., 20 mV). Thus, by providing different RM signal settings, a variety of STC timing schemes may be implemented.

By way of illustration, a design target of a 100 mV level on the SA signal may be implemented by simulating a memory, e.g., a 2K-by-8 memory, and adjusting its RM setting (for instance, RM[0:3]=[1011]). For another memory (e.g., a 4K-by-16 memory), the RM setting for achieving the targeted SA signal level may be different (for instance, RM[0:3]=[1000]).

Figure 5:
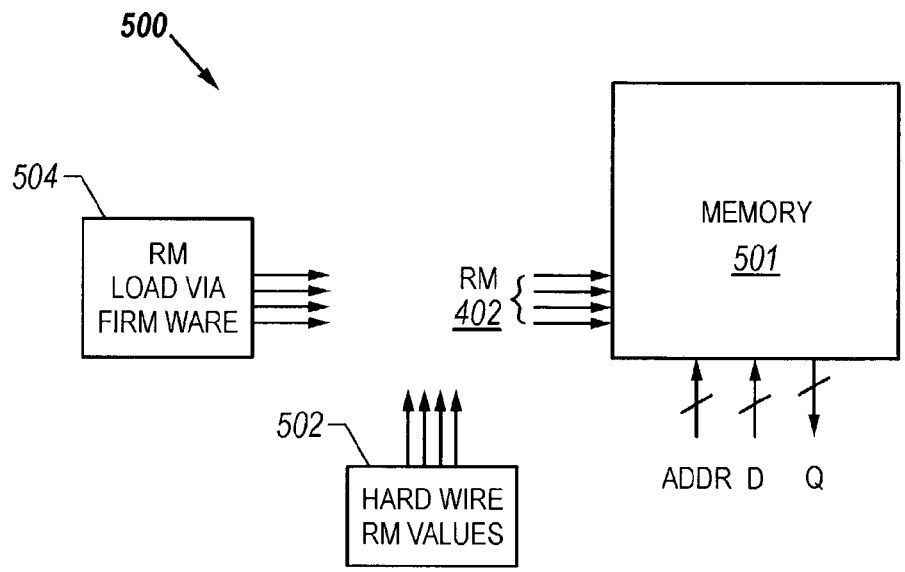
FIG. 5 depicts an exemplary arrangement for setting different RM values in a semiconductor memory.

Several options are possible for setting the RM values in a memory so as to configure its reference cell assembly and, hence, its STC/SAE setting. FIG. 5 depicts an exemplary arrangement 500 for setting different RM values in a semiconductor memory 501. In one implementation, a plurality of RM signals 402 associated with the semiconductor memory 501 may be hard-wired to a particular setting. Reference numeral 502 is a symbolic representation where the RM signals are hard-wired to a particular logic. For example, to obtain a setting of RM[0:3]=[1000], RM0 is hard-wired to $V_{DD}$ and RM[1:3] are hard-wired to $V_{SS}$. If the memory circuit has a problem in silicon, e.g., sub-optimal or out-of-range $t_{CO}$, the RM setting may be adjusted via well known post-fabrication repair techniques such as Focused Ion Beam (FIB) splicing, mask changes, etc.

In another implementation, an RM register of compatible size may be provided for the memory device 501, the contents of which register can be used to set the RM signals therefor. Preferably, the RM register contents may be loaded via firmware when the device is powered up. Reference numeral 504 is a symbolic representation of a firmware-loadable scheme for providing an adjusted RM value.

Figure 6:
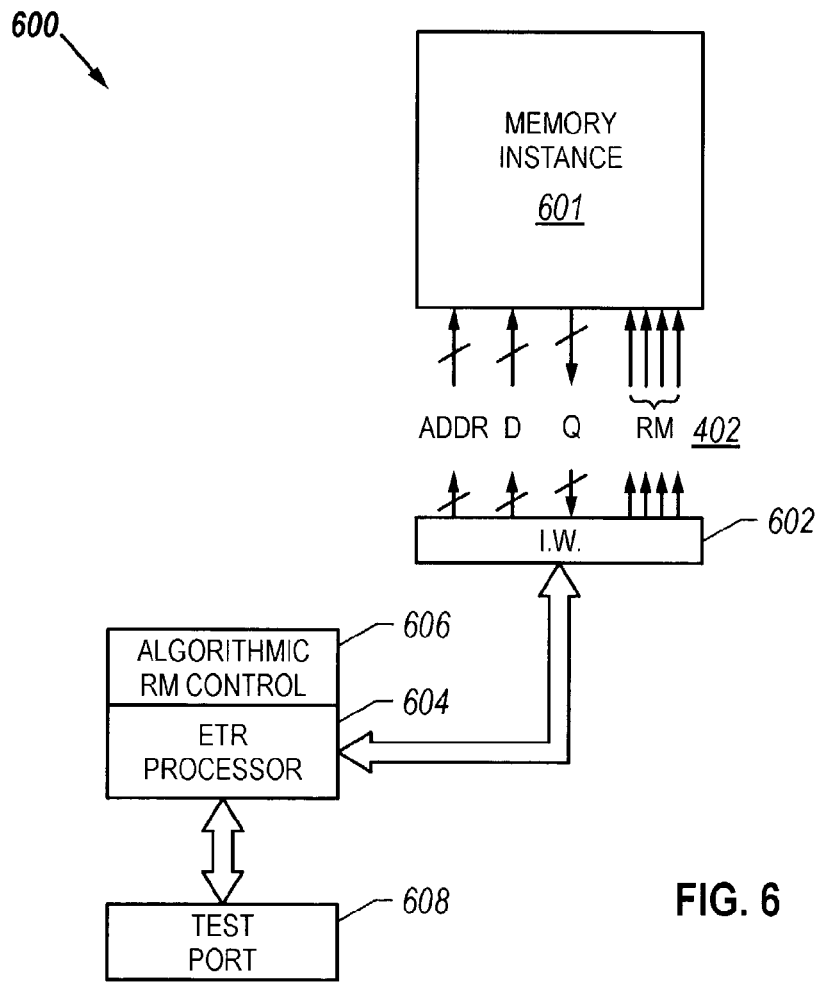
FIG. 6 depicts an another exemplary arrangement for setting different RM values in a semiconductor memory using an Embedded Test/Repair (ETR) scheme.

It should be apparent to one skilled in the art that the implementations described above are not particularly satisfactory where one or more memory instances having variable sizes are provided by way of a memory compiler arrangement, each memory instance thus requiring a potentially different RM setting. FIG. 6. depicts an exemplary arrangement 600 for setting different RM values in a semiconductor memory device having at least one memory instance 601, wherein an Embedded Test/Repair (ETR) scheme is used for determining and adjusting the RM value associated with the memory instance. In a presently preferred exemplary embodiment, the ETR scheme is provided as part of an integrated design environment and interface system wherein a variety of compilable components can be specified. The components can be used together to generate one or more memory instances (compiled on the basis of the configuration data supplied to a memory compiler), one or more wrapper interfaces (referred to as "Intelligent Wrappers" (IWs)) associated with the memory instances, and an ETR processor engine operable to support integrated test and repair capability. Appropriate graphic user interface (GUI) portions are available to specify the memory compiler, the IW compiler and the ETR processor compiler. Additional details concerning the ETR scheme and functionality can be found the following commonly owned co-pending U.S. patent application entitled: Embedded Test And Repair Scheme And Interface For Compiling A Memory Assembly With Redundancy Implementation, application Ser. No. 10/144,020 filed May 5,2002, in the name(s) of: Alex Shubat and Randall Lee Reichenbach, which is hereby incorporated by reference.

Continuing to refer to FIG. 6, memory instance 601 is generated based on its configuration data (i.e., NW, NB, column MUX data, and the like). Associated with the memory instance 601 is IW 602 which effectively operates as a high-level interface between the ETR processor engine 604 and the memory instance 601. Preferably, IW 602 includes an address generator, a data generator and a comparator. Accordingly, the interface between memory instance 601 and IW 602 includes address (ADDR) signals, Data In (D) signals, and Data Out (Q) signals. Furthermore, IW 602 is operable to provide RM signals 402 to the memory instance 601 for setting a particular STC/SAE loop based thereon. The ETR processor engine 604 is operable to execute a user-defined algorithmic RM control process 606, in addition to accepting user inputs via a test port 608. When the memory instance 601 is compiled, the ETR processor engine 604 is operable to determine a default RM value for the memory instance based on its configuration data, which RM value can be initially provided to IW 602. However, the algorithmic RM control and override command capability (preferably responsive to user input via test port 608) can be used in a variety of implementations to adjust the RM value for the memory instance.

Figure 7:
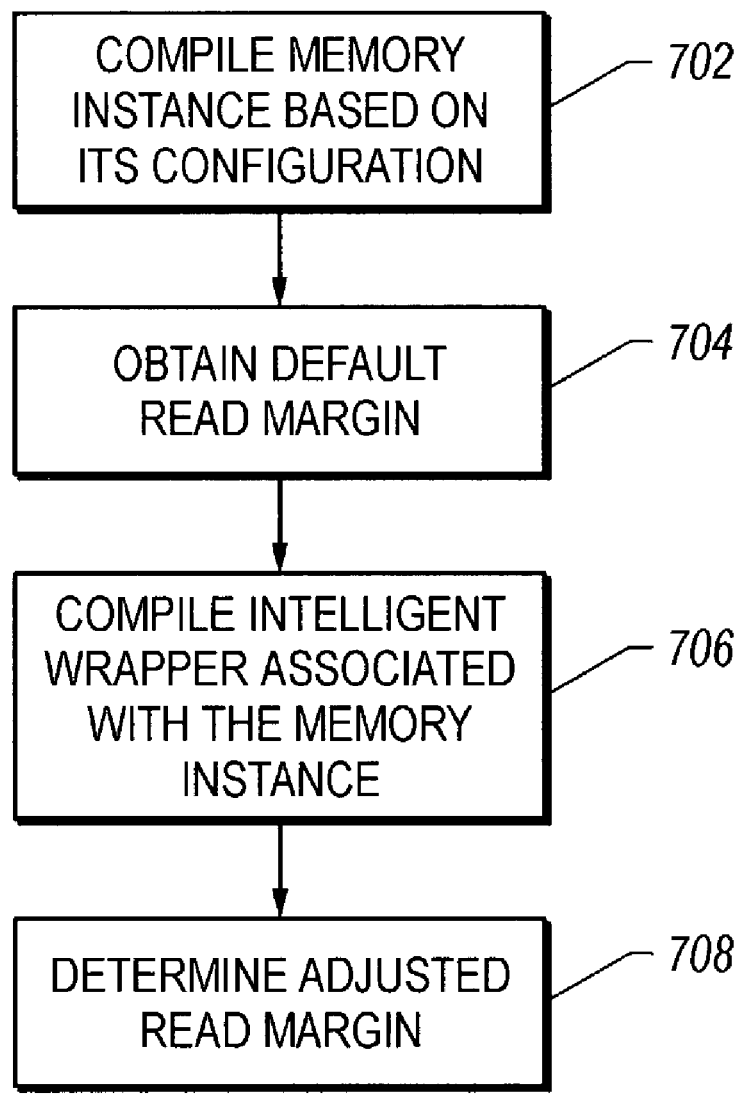
FIG. 7 is a flow chart of the steps involved in an exemplary methodology for adjusting a read margin setting in a semiconductor memory in accordance with the teachings of the present invention.

FIG. 7 is a flow chart of the steps involved in an exemplary methodology for effectuating an adjustable STC loop by adjusting a read margin setting in a semiconductor device having at least one memory instance. Upon compiling the memory instance based on its configuration data (step 702), a default RM value is determined by the ETR processor functionality associated with the semiconductor device (step 704). During the compilation of a wrapper interface (i.e., the Intelligent Wrapper) associated with the memory instance (step 706), the default RM value may be automatically provided to the wrapper interface. As pointed out earlier, the wrapper interface is operable to facilitate access operations with respect to the memory instance based on the default RM value. An adjusted RM value for the memory instance may be determined thereafter in a post-fabrication setting (step 708). Preferably, the adjusted RM value is provided in a predetermined manner for purposes of optimizing the memory instance's STC time setting. One of the features may involve the provision of an override command which supplies a different RM value through the ETR processor/IW interface. Preferably, an RM override command generator may be executed on the ETR processor in response to user inputs, and the override command(s) may thereafter be forwarded to the memory instance's IW for debug and optimization in an iterative process. As another feature, the memory instance may be stress-tested by using a number of predetermined patterns and conducting read access operations with respect to such patterns at different RM values. Furthermore, the algorithmic RM control process executing on the ETR processor is operable to determine an adjusted RM value by means of a suitable optimization flow. An exemplary optimization flow can start with the slowest RM setting and increment the settings iteratively to effect faster STC loops until the read access operations fail. The RM setting which immediately precedes the RM setting that results in access failure can be provided as an optimal RM value for the memory instance.

Based on the foregoing, it should be appreciated that the present invention advantageously provides an efficient and elegant scheme that optimizes the STC/SAE timing for memory access operations based on selectable loop delay. With a relatively small number of control signals (i.e., RM signals), numerous STC timing loops with adjustable RM settings can be implemented to suit a particular memory.

It is believed that the operation and construction of the present invention will be apparent from the foregoing Detailed Description. While the method and circuitry shown and described have been characterized as being preferred, it should be readily understood that various changes and modifications could be made therein without departing from the scope of the present invention as set forth in the following claims. For example, although the teachings of the present invention have been particularly described by way of a compilable memory, those skilled in the art should recognize that the underlying concepts can be advantageously implemented in standalone memory devices also. Additionally, the teachings of the present invention can be practiced with different types of memory instances, e.g., SRAM instances, DRAM instances, ROM/EPROM/EEPROM instances, Flash memory instances, embedded SOC devices, and the like. Moreover, the compilable memory arrays themselves may include any known architecture, including banking, divided wordlines, for example, with the RBL and RWL blocks and reference bitcell blocks provided in any physical layout with respect to the core array. Accordingly, all such modifications, substitutions, extensions, additions, combinations, et cetera, should be considered to be within the ambit of the present invention whose scope is limited solely by the claims appended hereinbelow.

What is claimed is:

1. A method of effectuating a self-timed clock loop for access operations in a compilable semiconductor memory device having at least one memory instance, comprising the steps:

compiling said at least one memory instance based on its configuration data;

determining a default access margin value for said at least one memory instance, wherein said default access margin value is operable to provide a self-timed clock signal with a particular time setting; and compiling a wrapper interface associated with said at least one memory instance based on its configuration data, said wrapper interface for providing said default access margin value to said at least one memory instance.

2. The method of effectuating a self-timed clock loop for access operations in a compilable semiconductor memory device as set forth in claim 1, wherein said wrapper interface is operable to provide a user-defined external access margin value to said at least one memory instance in override mode.

3. The method of effectuating a self-timed clock loop for access operations in a compilable semiconductor memory device as set forth in claim 1, wherein said wrapper interface is operable to provide an adjusted access margin value to said at least one memory instance, said adjusted access margin value being determined by an access margin optimization algorithmic process executed on an Embedded Test and Repair (ETR) processor engine associated with said compilable semiconductor memory device.

4. The method of effectuating a self-timed clock loop for access operations in a compilable semiconductor memory device as set forth in claim 1, wherein said configuration data comprises at least one of NW (the number of words), NB (the number of bits) and column MUX information associated with said at least one memory instance.

5. The method of effectuating a self-timed clock loop for access operations in a compilable semiconductor memory device as set forth in claim 1, wherein said wrapper interface is operable to provide an adjusted access margin value to said at least one memory instance, said adjusted access margin value being determined based on stress-testing said at least one memory instance using a number of predetermined test patterns.

6. A system for effectuating a self-timed clock loop for access operations in a compilable semiconductor memory device having at least one memory instance, comprising:

means for compiling said at least one memory instance based on its configuration data;

means for determining a default access margin value for said at least one memory instance, wherein said default access margin value is operable to provide a self-timed clock signal with a particular time setting; and means for compiling a wrapper interface associated with said at least one memory instance based on its configuration data, said wrapper interface for providing said default access margin value to said at least one memory instance.

7. The system for effectuating a self-timed clock loop for access operations in a compilable semiconductor memory device as set forth in claim 6, wherein said wrapper interface is operable to provide a user-defined external access margin value to said at least one memory instance in override mode.

8. The system for effectuating a self-timed clock loop for access operations in a compilable semiconductor memory device as set forth in claim 6, wherein said wrapper interface is operable to provide an adjusted access margin value to said at least one memory instance, said adjusted access margin value being determined by an access margin optimization algorithmic process executed on an Embedded Test and Repair (ETR) processor engine associated with said compilable semiconductor memory device.

9. The system for effectuating a self-timed clock loop for access operations in a compilable semiconductor memory device as set forth in claim 6, wherein said configuration data comprises at least one of NW (the number of words), NB (the number of bits) and column MUX information associated with said at least one memory instance.

10. The system for effectuating a self-timed clock loop for access operations in a compilable semiconductor memory device as set forth in claim 6, wherein said wrapper interface is operable to provide an adjusted access margin value to said at least one memory instance, said adjusted access margin value being determined based on stress-testing said at least one memory instance using a number of predetermined test patterns.

11. A semiconductor memory device, comprising:

means to generate an internal memory clock based on an external clock supplied thereto, said internal memory clock for providing a timing reference for an access operation with respect to a memory array;

means to commence said access operation based on a plurality of address signals;

a wrapper interface associated with said memory array, said wrapper interface operating to facilitate provision of an access margin value to said memory array for selecting a self-timed clock signal with respect to said access operation; and means to generate a self-timed clock signal with a particular time setting based on said access margin value.

12. The semiconductor memory device as set forth in claim 11, wherein said wrapper interface is operable to provide a user-defined external access margin value to said memory array in override mode.

13. The semiconductor memory device as set forth in claim 11, wherein said wrapper interface is operable to provide an adjusted access margin value to said memory array, said adjusted access margin value being determined by an access margin optimization algorithmic process executed on an Embedded Test and Repair (ETR) processor engine associated with said semiconductor memory device.

14. The semiconductor memory device as set forth in claim 11, wherein said configuration data comprises at least one of NW (the number of words), NB (the number of bits) and column MUX information associated with said at least one memory instance.

15. The semiconductor memory device as set forth in claim 11, wherein said wrapper interface is operable to provide an adjusted access margin value to said memory array, said adjusted access margin value being determined based on stress-testing said memory array using a number of predetermined test patterns.

* * * * *